United States Patent
Heuck et al.

(10) Patent No.: US 12,030,773 B2
(45) Date of Patent: Jul. 9, 2024

(54) METHOD FOR PRODUCING A WAFER CONNECTION

(71) Applicant: Robert Bosch GmbH, Stuttgart (DE)

(72) Inventors: Friedjof Heuck, Stuttgart (DE); Jochen Tomaschko, Gaeufelden (DE); Peter Schmollngruber, Aidlingen (DE); Thomas Friedrich, Moessingen-Oeschingen (DE); Volkmar Senz, Metzingen (DE); Franziska Rohlfing, Leonberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/265,451

(22) PCT Filed: Sep. 24, 2019

(86) PCT No.: PCT/EP2019/075753
§ 371 (c)(1),
(2) Date: Feb. 2, 2021

(87) PCT Pub. No.: WO2020/069925
PCT Pub. Date: Apr. 9, 2020

(65) Prior Publication Data
US 2021/0292160 A1   Sep. 23, 2021

(30) Foreign Application Priority Data
Oct. 4, 2018  (DE) .......................... 102018216971.3

(51) Int. Cl.
*G01L 9/00*  (2006.01)
*B81B 7/00*  (2006.01)
*B81C 1/00*  (2006.01)

(52) U.S. Cl.
CPC ........ *B81C 1/00238* (2013.01); *B81B 7/0006* (2013.01); *G01L 9/0041* (2013.01);
(Continued)

(58) Field of Classification Search
CPC ........ H01G 4/085; H01G 4/33; H01G 4/1272; H01L 21/0217; H01L 21/02164;
(Continued)

(56) References Cited

U.S. PATENT DOCUMENTS 9,139,423 B2 *  9/2015  Chien ................. B81C 1/00269
10,029,910 B1 * 7/2018  Tseng ................. B81C 1/00285
(Continued)

FOREIGN PATENT DOCUMENTS

CN    101168437 A    4/2008
CN    101360354 A    2/2009
(Continued)

OTHER PUBLICATIONS

English Translation of Mar. 23, 2021 ISR Report in PCT/EP2019/075753. No Date.*
(Continued)

*Primary Examiner* — Hrayr A Sayadian
(74) *Attorney, Agent, or Firm* — NORTON ROSE FULBRIGHT US LLP; Gerard A. Messina

(57) ABSTRACT

A method for producing a wafer connection between a first and a second wafer. The method includes providing a first and second material for forming a eutectic alloy, providing a first wafer having a receiving structure for a die structure, filling the receiving structure with the first material, providing a second wafer having a die structure, the second material being situated on the die structure, providing a stop structure on the first and/or second wafer, so that when the two wafers are joined, a defined stop is provided, heating the first and second material at least to the eutectic temperature
(Continued)

of the eutectic alloy, joining the first and second wafer so that the die structure is at least partly introduced into the receiving structure, the stop structure, the receiving structure, the die structure.

16 Claims, 4 Drawing Sheets

(52) U.S. Cl.
CPC . *B81B 2201/0264* (2013.01); *B81B 2207/012* (2013.01); *B81B 2207/07* (2013.01); *B81C 2203/035* (2013.01); *B81C 2203/0792* (2013.01)

(58) Field of Classification Search
CPC .............. H01L 21/022; H01L 29/0649; H01L 27/0629; H01L 21/02211; H01L 28/40; H01L 21/02274; B81C 1/00238; B81C 2203/0118; B81C 2203/035; B81C 2203/0792; G01L 9/0041; B81B 7/0051; B81B 7/0006; B81B 2207/012; B81B 2201/0264; B81B 2207/07
USPC .................................. 257/532, 415
See application file for complete search history.

(56) References Cited

U.S. PATENT DOCUMENTS

| | | | |
|---|---|---|---|
| 2009/0096088 | A1 | 4/2009 | Aimi et al. |
| 2010/0003772 | A1* | 1/2010 | Carlson ................... H01L 23/10 |
| | | | 257/E21.531 |
| 2011/0233621 | A1* | 9/2011 | Liu ....................... H01L 25/162 |
| | | | 257/E21.598 |
| 2012/0045628 | A1* | 2/2012 | Gonska ................. B81B 7/0029 |
| | | | 228/198 |
| 2012/0187509 | A1* | 7/2012 | Gottfried ............ B81C 1/00238 |
| | | | 257/E21.586 |
| 2013/0214400 | A1 | 8/2013 | Shu et al. |

FOREIGN PATENT DOCUMENTS

| | | |
|---|---|---|
| CN | 101483401 A | 7/2009 |
| CN | 101616864 A | 12/2009 |
| CN | 104627950 A | 5/2015 |
| CN | 104973564 A | 10/2015 |
| CN | 108367913 A | 8/2018 |

OTHER PUBLICATIONS

International Search Report for PCT/EP2019/075753, Issued Dec. 11, 2019.

* cited by examiner

METHOD FOR PRODUCING A WAFER CONNECTION

FIELD

The present invention relates to a method for producing a wafer connection between a first and a second wafer.

Although the present invention is generally applicable to any MEMS sensors, the present invention is described in relation to MEMS pressure sensors.

BACKGROUND INFORMATION

Conventional packaging techniques make it necessary to mechanically decouple the pressure-sensitive part of a pressure sensor, the pressure sensor membrane, from the rest of the sensor using special spring structures, and in this way to make it independent of influences that result from its design and its connection technology. External influences that place the pressure sensor under mechanical stress, such as bending, are, inter alia, for example mechanical tensioning due to a molding process, a construction having a mix of materials having different thermal coefficients of expansion, and stress due to solder connections of the sensor installed on a circuit board.

In conventional MEMS processes, for a stress decoupling a relatively thin wafer is required for the MEMS sensor, in particular having a thickness less than 300 μm. These wafer thicknesses are not processable, and the wafer is therefore mounted on a carrier wafer, which can be provided in the form of an evaluation ASIC.

For an electrical connection between the MEMS sensor and the evaluation ASIC, it is conventional to use a eutectic bonding having suitable chip-to-chip contacts.

SUMMARY

In a specific example embodiment, the present invention provides a method for producing a wafer connection between a first and a second wafer, including the steps:
providing a first and second material for forming a eutectic alloy,
providing a first wafer having a receiving structure for a die structure,
filling the receiving structure with the first material,
providing a second wafer having a die structure, the second material being situated on the die structure,
providing a stop structure on the first and/or second wafer, in such a way that when the two wafers are joined a defined stop is provided,
heating at least the first and second material at least to the eutectic temperature of the eutectic alloy,
joining the first and second wafer in such a way that the die structure is at least partly introduced into the receiving structure, the stop structure, the receiving structure, the die structure, and the quantity of first and second material being dimensioned such that after the joining of the two wafers, the eutectic alloy of the two materials remains within the receiving structure, and the die structure is at least partly surrounded by the eutectic alloy.

In a further specific example embodiment, the present invention provides a MEMS sensor, produced using a method in accordance with an example embodiment of the present invention, including:
a first wafer having a receive structure for a die structure,
a second wafer having a die structure, a stop structure being situated on the first and/or second wafer, in order to provide a defined distance between the two wafers, and material of a eutectic alloy, in which the die structure is at least partly immersed, being situated in the receiving structure.

One of the advantages that may be achieved is that in this way a reliable mechanical connection is enabled between two components, in this case wafers.

Further features, advantages, and further specific embodiments of the present invention are described below, or are derivable from the disclosure herein.

According to an advantageous development of the present invention, one of the two materials is only partly melted. This enables a rapid and energy-efficient joining of the first and second wafer, because for example the at least one material can be "squeezed" solely by the contact pressure.

According to a further advantageous development of the present invention, the thickness of the die structure is made greater than the thickness of the stop structure. The advantage of this is that in this way a reliable accommodation of the die structure in the receiving structure is enabled.

According to a further advantageous development of the present invention, the stop structure, the receiving structure, the die structure, and the quantity of first and second material are dimensioned such that after the joining of the two wafers, the die structure is situated at least partly below the surface of the volume of the first material in the receiving structure before the joining. This results in a reliable and stable bonding.

According to a further advantageous development of the present invention, after the joining there remains a collection volume between the first and second wafer. In this way, on the one hand material of the eutectic alloy is prevented from exiting from the receiving structure during the joining of the first and second wafer. In addition, process tolerances in the manufacturing of the die structure and the quantity of first and second material can be compensated. This also holds for the immersion of the die structure in the eutectic alloy of the first and second material.

According to a further advantageous development of the present invention, the receiving structure and the stop structure are situated at a distance from one another on the first wafer. The advantage of this is that, due to the additional distance, the probability of a break in the receiving structure is reduced, and in this way no material can move into the substructure of the stop structure.

According to a further advantageous development of the present invention, the first material is provided with at least two openings, these being configured such that they correspond to the edges of the die structure during the joining of the two wafers, in such a way that the distance between the openings is equal to or larger than the distance of the edges. Here, the openings can in particular have a size in the micrometer range.

These facilitate, underneath the die structure, the formation of a eutectic ratio of the first and second material.

According to a further advantageous development of the present invention, the second material is configured on the die structure with a width-thickness ratio of at least 10:1, advantageously at least 100:1, in particular at least 1000:1. The advantage of this is that in this way the volume of the second material is made as broad and thin as possible, so that a reliable fixing of the first and second wafer on one another is enabled, in order to provide a solid mechanical connection.

According to a further advantageous development of the present invention, the width of the die structure is made larger than the width of the second material. In this way, a particularly reliable fixing of the two wafers on one another is enabled.

According to a further advantageous development of the present invention, the second wafer is made in non-conductive fashion underneath the die structure. The advantage of this is that the mechanical stability is increased, because conductive materials are normally soft at corresponding bonding temperatures. In this way, a denting in the region of the die structure when the two wafers are joined is prevented.

According to a further advantageous development of the present invention, the die structure and/or the receiving structure are made of dielectric material, in particular $SiO_2$ and/or SiN. In this way, on the one hand a mechanically stable connection, and on the other hand a passivation, are achieved.

According to a further advantageous development of the present invention, the first and second material are provided as electrically conductive materials. In this way, in addition to a mechanical connection, an electrical connection of the two wafers can also be produced.

Further features and advantages of the present invention result from the figures, and from the associated description herein.

Of course, the features mentioned above and explained below may be used not only in the respectively indicated combination, but also in other combinations, or by themselves, without departing from the scope of the present invention.

Preferred embodiments and specific embodiments of the present invention are shown in the figures, and are explained in more detail below, in which identical reference characters relate to identical or similar or functionally identical components or elements.

BRIEF DESCRIPTION OF THE DRAWING

Shown in schematic form and in cross-section are.

DETAILED DESCRIPTION OF EXAMPLE EMBODIMENTS

Figure 1:
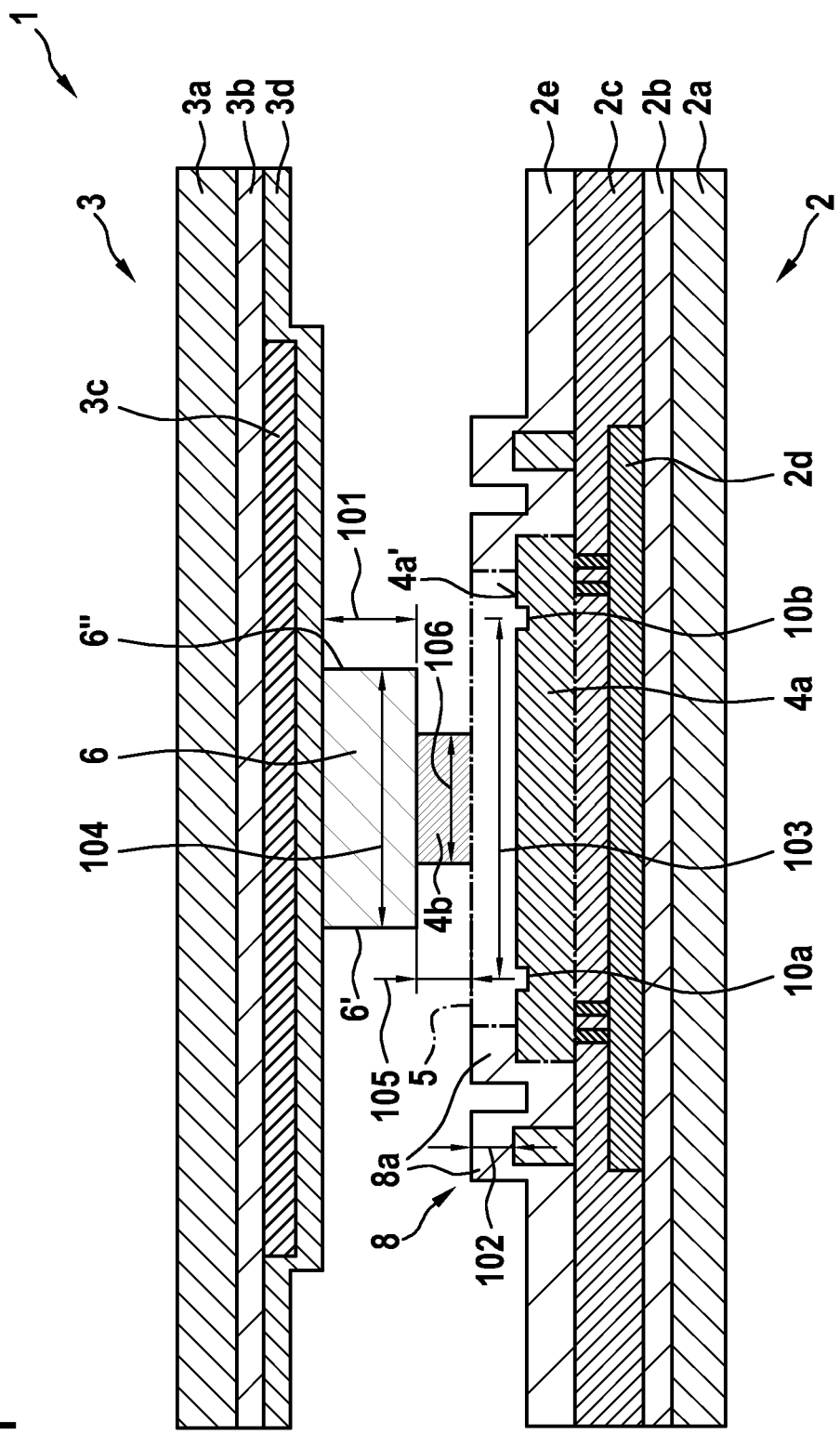
FIG. 1 shows, in schematic form and in cross-section, two wafers before joining, according to a specific example embodiment of the present invention.
Figure 2:
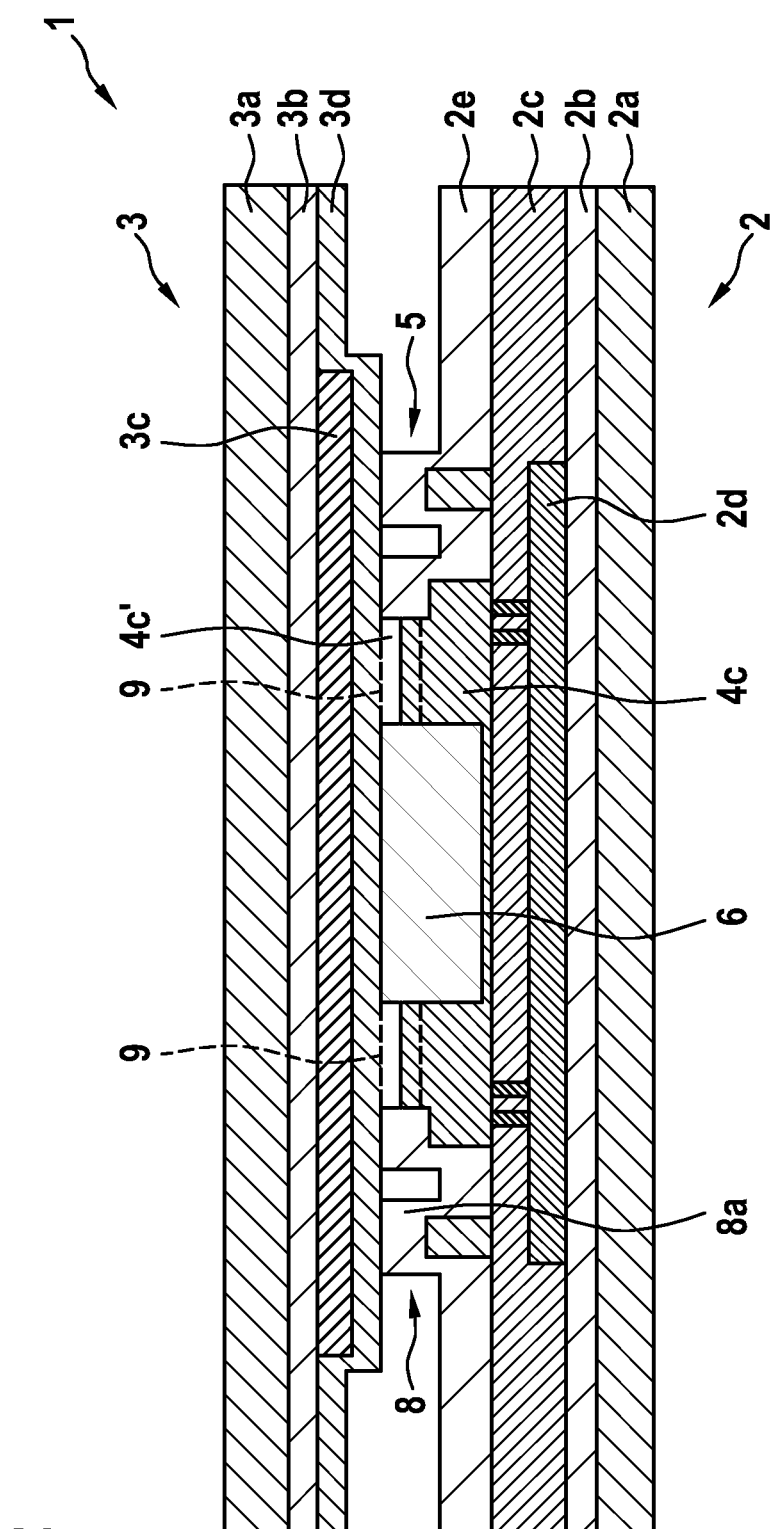
FIG. 2 shows, in schematic form and in cross-section, the connected two wafers according to FIG. 1 after their joining, according to a specific example embodiment of the present invention.

FIG. 1 shows two wafers before joining according to a specific embodiment of the present invention, and FIG. 2 shows the joined two wafers according to FIG. 1 after their joining according to a specific example embodiment of the present invention.

In each of FIG. 1 and FIG. 2, a first wafer 2, in the form of an ASIC, is shown at the bottom. First wafer 2 has a silicon layer as lowest layer 2a. On the upper side of silicon layer 2a, an ASIC backend layer 2b is situated on which, in turn, an aluminum layer 2d is situated in some regions. Aluminum layer 2d is, like the rest of ASIC backend layer 2b, surrounded, or covered, by a non-conducting layer 2c, for example made of silicon dioxide. On the upper side of non-conducting layer 2c and of aluminum layer 2d there is situated a passivation layer 2e made of dielectric material. Here, the dielectric material can include silicon dioxide $SiO_2$ or silicon nitride SiN, or a combination of these. The vertical layer thicknesses of the named layers 2a-2d may here be between 0.1 μm and 3 μm, preferably 0.2 μm to 2 μm.

Passivation layer 2e has a receiving structure in cross-section in the form of a trough 5. On the lateral edges of trough 5 there are situated spacers 8 that form a stop 8a for second wafer 3. Here, trough 5 is filled with aluminum 4a up to a level 4a'; that is, an aluminum layer is situated in trough 5. Aluminum layer 4a has openings 10a, 10b on its surface that have a distance 103 from one another. This distance 103 is larger than width 104 of a die 6 of second wafer 3.

From top to bottom in FIGS. 1 and 2, second wafer 3 has the following structure. A layer 3a, in the form of a silicon layer, is situated as first layer. On this layer there is situated an electrical passivation layer 3b, which may be made of silicon dioxide. The thickness of passivation layer 3b here is between 0.05 μm and 2 μm, in particular between 0.1 μm and 1 μm. In addition, an electrically conductive layer 3c, for example including electrical strip conductors, is situated thereon in a subregion, this layer being completely surrounded downwardly by an electrical passivation layer 3d. Here, the layer thickness of the two layers 3c and 3d is between 0.05 μm and 2 μm, in particular 0.1 μm and 1 μm. Die 6 mentioned above, having a rectangular cross-section, is now situated on passivation layer 3c, and a second conductive material 4b, here in the form of germanium, is applied on this die.

In detail, die 6 thus produces a mechanical connection between the two wafers 2, 3, after a bonding of the first and second conductive material 4a, 4b. During and after the bonding, die 6 does not deform. Die 6 acts as a reference variable for the mechanical connection. Die 6 displaces the situation of the germanium 4b sufficiently far into the oppositely situated passivation opening, or receiving structure in the form of trough 5, so that when the two wafers 2, 3 are pressed together, the germanium 4b is first to come into contact with the oppositely situated aluminum 4a.

The receiving structure, in the form of a trough 5, defines the region in which the "liquid" aluminum-germanium alloy, or Al—Ge, 4c is situated during the bonding process. It collects possible process tolerances of layer thicknesses 102, 105, 101 and of structure widths 103, 104, 106, so that the aluminum-germanium alloy 4c is pressed out of trough 5, and die 6 reliably comes to lie inside trough 5.

Spacers 8 terminate the bonding frames, i.e. the structures and layers involved in the bonding process, define the height of trough 5, and accept the force resulting from the contact pressure during the bonding process, or after the melting of the eutecticum of aluminum-germanium alloy 4c.

The dimensioning of the eutecticum—in other words, the quantity and the shape of the configuration of aluminum-germanium alloy 4c, including the two conductive materials 4a, 4b and the individual regions—results from the dimensioning of die 6, of trough 5, and of spacers 8.

In detail, die 6 has a width 104 that scales linearly with the mechanical loadability, and can have a size of about 10-100 μm. The height 101 of die 6 is in particular selected so that it is larger than the thickness 102 of the uppermost passivation layer 2e of ASIC 3. Advantageously, after the bonding, die 6 is situated underneath the initial aluminum surface 4a'. This results in a more reliable stable bonding. In order to bring this about reliably, height 101 is defined on the basis of process tolerances of layer thicknesses 101, 102, 105, which define die height 101, and of passivation layer 2e. In particular, die 6 is immersed under the initial Al surface 4a', preferably between 0.001 µm and 1 µm.

Before the bonding, the width of trough 5 is defined by die width 104 and the bonding offset to the left and to the right of die 6. The height of trough 5 is defined by the layer thickness of the aluminum 4a and the thickness of passivation layer 2e.

After the bonding, trough 5 is defined
- in the vertical direction, in relation to second wafer 3, by the thickness of passivation layer 2e and height 101 of the die, and/or
- in the vertical direction, in relation to first wafer 2 by an adjoining (final) via layer, and/or
- in the horizontal direction, by the distance of the spacers 8 situated at both sides of trough 5.

Likewise, if appropriate a collection volume 9 present after the bonding process, situated to the left and to the right next to die 6, is defined by the horizontal distance between die 6 and spacers 8 and the height 102 of passivation layer 2e. Aluminum-germanium alloy 4c is situated in collection volume 9 after the bonding process. Collection volume 9 is dimensioned such that process tolerances of die 6 and passivation layer 2e, as well as the situation of the germanium 4b and the aluminum 4a and the displaced volume resulting from the immersion of die 6 under the initial aluminum surface 4a', are taken into account.

As soon the germanium 4b and aluminum 4a have adequately softened and been alloyed with one another and compressed during the bonding process, die 6 can no longer accept any more force from the contact pressure. Thus, the complete contact pressure is loading spacers 8. These spacers are in particular designed such that no damage occurs to the structures underneath spacers 8. In this way, there results a width for these spacers that is on the order of magnitude of the width 106 of the germanium 4b situated on die 6.

In a further specific embodiment, a distance of between 1 µm and 10 µm is provided between trough 5 and spacers 8. This distance additionally secures against a breakage of the trough edge, so that no germanium 4a can move into the substructure of the respective spacer 8.

The volume ratio between germanium 4b and aluminum 4a is in particular selected as close as possible to the eutectic ratio. The volume ratio is as far as possible selected such that, given corresponding thicknesses of layers 2a-2e, 3a-3d, collection volume 9 is half filled.

The volume of the germanium 4b is selected as wide as possible, for example having a width between 10-100 µm, and is made thin, having a thickness between 100 nm-1 µm. The applied germanium 4b in particular lies within the width 104 of the die.

The width of the situation of the aluminum 4a is defined by the width of trough 5. The height of the situation of the aluminum 4a can be on the order of magnitude between 0.5 µm and 2 µm.

Aluminum layer 4a can advantageously have a small interruption, opening, or recess 10a, 10b, on the order of magnitude of a depth between 0.5 µm and 1 µm, symmetrically to the left and to the right corresponding to the dimensions of die 6, in other words next to the lateral edges 6' 6" of die 6. When introducing die 6 into trough 5, this facilitates the formation of a eutectic ratio for aluminum-germanium alloy 4c.

Die 6 can advantageously be made of a dielectric material such as $SiO_2$ or SiN, or also of aluminum, this then being covered by a suitable germanium diffusion barrier, for example TiN or TaN.

Figure 3:
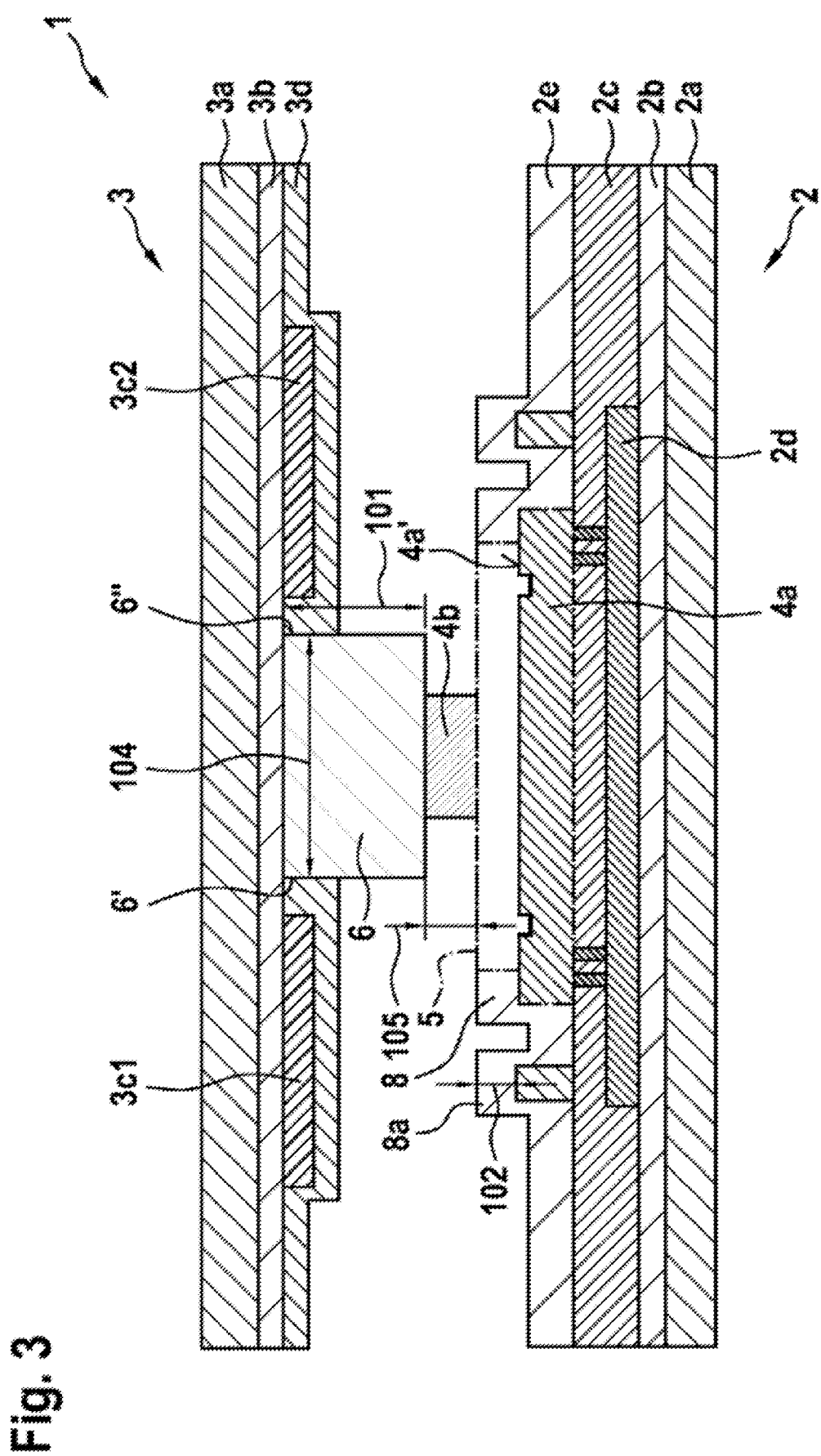
FIG. 3 shows, in schematic form and in cross-section, two wafers before joining, according to a specific example embodiment of the present invention.

FIG. 3 shows two wafers before joining, according to a specific example embodiment of the present invention.

FIG. 3 shows essentially the same construction of the two wafers 2, 3 as shown in FIG. 1. Differing from the specific embodiment of FIG. 1, in the specific embodiment of FIG. 3 the two wafers 3 do not have any electrical strip conductors underneath die 6, i.e. the continuous layer 3c under die 6, shown in FIG. 1, is now essentially interrupted by die 6 and divided into two sub-regions 3c1, 3c2. This increases the mechanical stability of the overall system, because the strip conductors in layer 3c are standardly made of an aluminum-copper alloy that is relatively soft at corresponding bonding temperatures.

Figure 4:
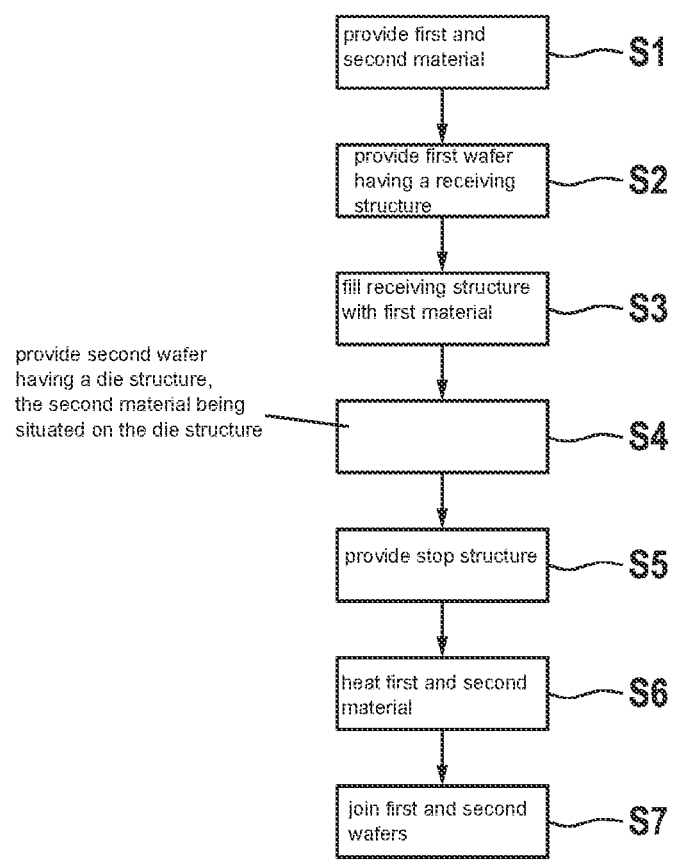
FIG. 4 shows steps of a method according to a specific example embodiment of the present invention.

FIG. 4 shows steps of a method according to a specific example embodiment of the present invention.

FIG. 4 shows steps of a method for producing a wafer connection between a first wafer and a second wafer.

The method includes the following steps:

In a first step S1, a first and second material are provided for forming a eutectic alloy.

In a further step S2, a first wafer is provided having a receiving structure for a die structure.

In a further step S3, the receiving structure is filled with the first material.

In a further step S4, a second wafer is provided having a die structure, the second material being situated on the die structure.

In a further step S5, a stop structure is provided on the first and/or second wafer, in such a way that a defined stop is provided during the joining of the two wafers.

In a further step S6, at least the first and second material are heated at least to the eutectic temperature of the eutectic alloy.

In a further step S7, the first and second wafers are joined in such a way that the die structure is at least partly introduced into the receiving structure, the stop structure, the receiving structure, the die structure, and the quantity of first and second material being dimensioned such that after the joining of the two wafers the eutectic alloy of the two materials remains inside the receiving structure, and the die structure is at least partly surrounded by the eutectic alloy.

In sum, at least one of the specific embodiments has at least one of the following advantages:
- Mechanical and in particular, additionally, electrical connection between two wafers.
- Low-cost manufacture.
- Simple manufacture.
- Simple handling.

Although the present invention has been described on the basis of preferred exemplary embodiments, it is not limited thereto, but rather can be modified in many ways.

What is claimed is:

1. A method for producing a wafer connection between a first wafer and a second wafer, the method comprising:
   providing a first material and a second material for forming a eutectic alloy;
   providing the first wafer having a receiving structure for a die structure;
   filling the receiving structure with the first material;
   providing the second wafer having a die structure, the second material being situated on the die structure;

providing a stop structure on the first wafer and/or the second wafer, so that when the first wafer and the second wafer are joined, a defined stop is provided;

heating at least the first material and the second material at least to a eutectic temperature of the eutectic alloy; and joining the first and second wafer so that the die structure is at least partly introduced into the receiving structure;

wherein the stop structure, the receiving structure, the die structure, and a quantity of the first material and the second material are dimensioned such that after the joining of the first wafer and the second wafer, the eutectic alloy of the first material and the second material remains within the receiving structure, and the die structure is at least partly surrounded by the eutectic alloy.

2. The method as recited in claim 1, wherein a melting of at least one of the first and second materials taking place only partly.

3. The method as recited in claim 1, wherein a thickness of the die structure is produced larger than the thickness of the stop structure.

4. The method as recited in claim 1, wherein the stop structure, the receiving structure, the die structure, and the quantity of the first and second material being dimensioned such that after the joining of the two wafers, the die structure is situated at least partly underneath a surface of a volume of the first material in the receiving structure before the joining.

5. The method as recited in claim 1, wherein a collection volume remain between the first and second wafer after the joining.

6. The method as recited in claim 1, wherein the receiving structure and the stop structure on the first wafer are situated at a distance from one another.

7. The method as recited in claim 1, wherein the first material is provided with at least two openings, the openings being situated such that they correspond to edges of the die structure during the joining of the first wafer and the second wafer, so that a distance between the openings is equal to or greater than a distance of the edges.

8. The method as recited in claim 1, wherein the second material is situated on the die structure with a width to thickness ratio of at least 10:1.

9. The method as recited in claim 8, where in ratio is at least 100:1.

10. The method as recited in claim 9, wherein the ratio is at least 1000:1.

11. The method as recited in claim 8, wherein a width of the die structure is larger than the width of the second material.

12. The method as recited in claim 1, wherein the second wafer is situated non-conductively underneath the die structure.

13. The method as recited in claim 1, wherein the die structure and/or the receiving structure is produced from a dielectric material, the dielectric material being $SiO_2$ and/or SiN.

14. The method as recited in claim 1, wherein the first and second material are electrically conductive materials.

15. A micro-electro-mechanical system (MEMS) sensor, comprising:
a die structure;
a first wafer having a receiving structure, which is in the form of a trough and which receives the die structure;
a second wafer;
a stop structure situated on the first wafer and/or the second wafer to provide a defined distance between the first wafer and the second wafer, wherein the die structure provides a mechanical connection between the first wafer and the second wafer; and
a eutectic alloy material in the receiving structure, wherein the eutectic alloy material is formed from a first material and a second material, and wherein the die structure is in the receiving structure and is at least partly surrounded by the eutectic alloy material.

16. The MEMS sensor as recited in claim 15, wherein the stop structure, the receiving structure, and the die structure are dimensioned such that the eutectic alloy material remains within the receiving structure.

* * * * *